METHOD OF PHOTOPOLYMERIZING POLYMERIZABLE COMPOSITIONS CONTAINING GROUP VA ONIUM SALTS

This is a division of application Ser. No. 638,993, filed Dec. 9, 1975, now U.S. Pat. No. 4,069,056, which is a continuation of Ser. No. 466,376, filed May 2, 1974, now abandoned.

Prior to the present invention, it was generally known that a variety of organic materials such as vinyl monomers possessing a high electron density in the double bond, were subject to cationic polymerization. A small amount of a Lewis Acid catalyst, such as SnCl$_4$, SbF$_5$, AsF$_5$, etc. readily polymerizes vinyl monomers such as styrene, butadiene, vinyl alkyl ethers, etc. It is often difficult, however, to generate the Lewis Acid catalyst at the appropriate time for polymerization, or have it properly dispersed throughout the vinyl monomer to achieve uniform results.

Additional organic materials such as aldehydes, cyclic ethers and cyclic esters also can undergo cationic polymerization in the presence of trace amounts of Lewis Acids. Such materials when catalyzed can be employed in coating applications, as encapsulants, and for a variety of thermoplastic applications. However, optimum results cannot be achieved because it is difficult to achieve dispersion or generation of the Lewis Acid in a desirable manner. A further description of the principles by which cationic polymerization of the above described organic materials can be achieved with Lewis Acids is described in *Principles of Polymer Chemistry*, pp 217-222 by P. J. Flory, Cornell University Press, Ithica, New York (1953), and *Polymer Reviews* by J. Furukawa and T. Saegusa, Interscience Publishers, New York (1953). Another class of materials which undergoes cationic polymerization in the presence of Lewis Acids is organosilicon cyclics as shown by W. Noll, *The Chemistry and Technology of Silicones*, pp 219-226, Academic Press, New York (1968).

Improved methods of generating and releasing Lewis Acids to effect polymerization of organic materials can be achieved by using heat sensitive Lewis Acid-tertiary amine complexes, such as complexes of boron trifluoride-tertiary amine. Although improved pot life can be obtained by such tertiary amine complexes, elevated temperatures such as up to 160° C. and substantially long cure times render such methods unsuitable for continuous cures or for the manufacture of delicate electronic devices.

Schlesinger U.S. Pat. No. 3,708,296 or Watt U.S. Pat. No. 3,794,576 describe methods of releasing Lewis Acid catalysts by the use of ultraviolet radiation sensitive aromatic diazonium salts. Although actinic irradiation substantially minimizes the disadvantages of the heat cure, the pot life of the polymerizable mixture during the shelf period is often unsatisfactory. As a result, a stabilizer must be used to prolong the shelf period of the polymerizable mixture. Nitrogen is also generated during cure which can render the resulting product unsuitable in a variety of applications.

The present invention is based on the discovery that certain photosensitive aromatic onium salts of Group Va elements, as illustrated by the formula,

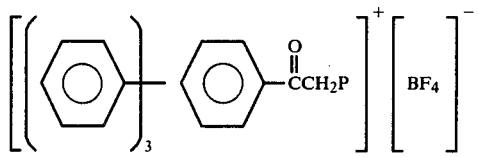

can be a source of Lewis Acid such as boron trifluoride, phosphorous pentafluoride, arsenic pentafluoride, etc., when exposed to radiant energy. A variety of radiation polymerizable compositions are provided by incorporating the photosensitive aromatic onium salt into various cationically polymerizable organic materials as described below. Unlike polymerizable compositions containing the above described diazonium salts, the polymerizable compositions of the present invention, which can be in the form of a solid or liquid do not require a stabilizer. Even after extended shelf periods under normal daylight conditions, the polymerizable compositions of the present invention do not exhibit any significant change in properties. In addition, there is no problem with bubbling as characterized by organic resin compositions containing diazonium salts.

The aromatic onium salts of Group Va elements utilized in the curable compositions of the present invention can be more particularly defined by the following formula, $$[ (R)_a(R^1)_b(R^2)_c X ]_d^+ [MQ_e]^{-(e-f)} \qquad (I)$$

where R is a monovalent aromatic organic radical selected from carbocyclic radicals and heterocyclic radicals, R$^1$ is a monovalent organic aliphatic radical selected from alkyl, cycloalkyl and substituted derivatives thereof, R$^2$ is a polyvalent organic radical forming an aromatic heterocyclic or fused ring structure with X, X is a Group Va element selected from N, P, As, Sb and Bi, M is a metal or metalloid, Q is a halogen radical, a is a whole number equal to 0 to 4 inclusive, b is a whole number equal to 0 to 2 inclusive, c is a whole number equal to 0 to 2 inclusive, and the sum of a+b+c is a value equal to 4 or the valence of X, d = e−f f = valence of M and is an integer equal to from 2 to 7 inclusive e is >f and is an integer having a value up to 8.

Radicals included by R are, for example C$_{(6-13)}$ aromatic hydrocarbon radicals such as phenyl, tolyl, napthyl, anthryl and such radicals substituted with up to 1 to 4 monovalent radicals such as C$_{(1-8)}$ alkoxy, C$_{(1-8)}$ alkyl, nitro, chloro, hydroxy, etc.; arylacyl radicals such as phenylacyl, etc.; arylalkyl radicals such as phenyl ethyl; aromatic heterocyclic radicals such as pyridyl, furfuryl, etc. R$^1$ radicals include C$_{(1-8)}$ alkyl, C$_{(3-8)}$ cycloalkyl, substituted alkyl such as haloalkyl, for example, chloroethyl; alkoxy alkyl such as —C$_2$H$_4$OCH$_3$, etc.; alkylacyl such as —CH$_2$COOC$_2$H$_5$; ketoalkyl such as —CH$_2$COCH$_3$, etc. Radicals included by R$^2$ are, for example,

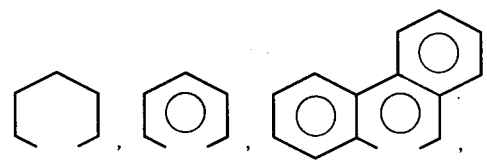

United States Patent [19]

Crivello

[11] 4,150,988
[45] Apr. 24, 1979

[54] METHOD OF PHOTOPOLYMERIZING POLYMERIZABLE COMPOSITIONS CONTAINING GROUP Va ONIUM SALTS

[75] Inventor: James V. Crivello, Elnora, N.Y.

[73] Assignee: General Electric Company, Schenectady, N.Y.

[21] Appl. No.: 838,154

[22] Filed: Sep. 30, 1977

Related U.S. Application Data

[60] Division of Ser. No. 638,993, Dec. 9, 1975, Pat. No. 4,069,056, which is a continuation of Ser. No. 466,376, May 2, 1974, abandoned.

[51] Int. Cl.$^2$ .................. G03C 5/00; G03C 1/94; G03C 1/68; C08F 2/46
[52] U.S. Cl. .................. 96/35.1; 96/86 P; 96/115 R; 96/115 P; 204/159.18; 204/159.23; 204/159.24
[58] Field of Search ............ 96/115 R, 115 P, 35.1, 96/86 P; 204/159.18, 159.23, 159.24

[56] References Cited

U.S. PATENT DOCUMENTS

| | | | |
|---|---|---|---|
| 3,486,891 | 12/1969 | Wilhelm et al. | 96/35.1 |
| 3,495,987 | 2/1970 | Moore | 96/115 P |
| 3,567,453 | 3/1971 | Borden | 96/115 P |
| 3,627,656 | 12/1971 | Miller | 204/159.24 |
| 3,699,025 | 10/1972 | Jenkins et al. | 204/159.18 |
| 3,782,961 | 1/1974 | Takahashi et al. | 96/35.1 |
| 3,785,821 | 1/1974 | Notley | 96/115 P |
| 3,801,328 | 4/1974 | Takimoto et al. | 96/35.1 |
| 3,801,638 | 4/1974 | Cerwonka | 96/35.1 |
| 3,879,312 | 4/1975 | Udding et al. | 260/2 |

OTHER PUBLICATIONS

Banks, Chemical Review, vol. 66, No. 3, 5/1966, pp. 243-266.

*Primary Examiner*—Jack P. Brammer
*Attorney, Agent, or Firm*—William A. Teoli; Joseph T. Cohen; Charles T. Watts

[57] ABSTRACT

Cationic polymerization of a variety of organic materials such as vinyl monomers, prepolymers, cyclic ethers, cyclic esters, cyclic amines, cyclic sulfides and organosilicon cyclics can be achieved by the use of certain radiation sensitive aromatic onium salts of Group Va elements. In addition, polymerizable compositions are provided which can be used as coating compounds, molding resins, adhesives, etc.

2 Claims, No Drawings

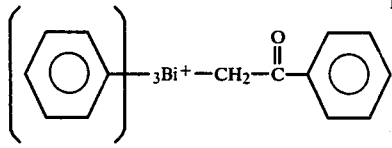

The Group Va onium salts of formula I are well known. Some of these compounds can be made by the procedures described by J. Goerdeler, Methoden der Organishen Chimie, 11/12, 591-640 (1958) and K. Sasse, ibid., 12/1, 79-112 (1963).

Included by the vinyl organic monomers which can be used in the practice of the invention to make the polymerizable compositions which are convertible to thermoplastic polymers are, for example, styrene, vinyl acetamide, α-methyl styrene, isobutyl vinylether, n-octyl vinylether, acrolein, 1,1-diphenylethylene, β-pinene; vinyl arenes such as 4-vinyl biphenyl, 1-vinyl pyrene, 2-vinyl fluorene, acenaphthylene, 1 and 2-vinyl naphthylene; 9-vinyl carbazole, vinyl pyrrolidone, 3-methyl-1-butene; vinyl cycloaliphatics such as vinylcyclohexane, vinylcyclopropane, 1-phenylvinylcyclopropane; dienes such as isobutylene, isoprene, butadiene, 1,4-pentadiene, etc.

Some of the vinyl organic prepolymers which can be used to make the polymerizable compositions of the present invention are, for example, $CH_2=CH-O-(CH_2-CH_2O)_n-CH=CH_2$, where n is a positive integer having a value up to about 1000 or higher; multi-functional vinylethers, such as 1, 2, 3-propane trivinyl ether, trimethylolpropane trivinyl ether, prepolymers having the formula,

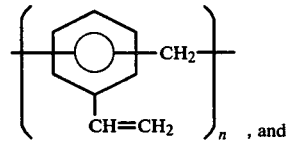

low molecular weight polybutadiene having a viscosity of from 200 to 10,000 centipoises at 25° C., etc. Products resulting from the cure of such compositions can be used as printing inks and other applications typical of thermosetting resins.

A further category of the organic materials which can be used to make the polymerizable compositions are cyclic ethers which are convertible to thermoplastics. Included by such cyclic ethers are, for example, oxetanes such as 3,3-bischloromethyloxetane alkoxyoxetanes as shown by Schroeter U.S. Pat. No. 3,673,216, assigned to the same assignee as the present invention; oxolanes such as tetrahydrofuran, oxepanes, oxygen containing spiro compounds, trioxane, dioxolane, etc.

In addition to cyclic ethers there are also included cyclic esters such as β-lactones, for example, propiolactone, cyclic amines, such as 1,3,3-trimethylazetidine and organosilicon cyclics, for example, materials included by the formula

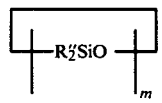

where R″ can be the same or different monovalent organic radical such as methyl or phenyl and m is an integer equal to 3 to 8 inclusive. An example of an organosilicon cyclic is hexamethyl trisiloxane, octamethyl tetrasiloxane, etc. The products made in accordance with the present invention are high molecular weight oils and gums.

In particular instances, depending upon the compatability of the onium salt with the organic material, the onium salt can be dissolved or dispersed in an organic solvent such as nitromethane, acetonitrile, etc., prior to its incorporation into the organic material. Experience has shown that the proportion of onium salt to organic material can vary widely inasmuch as the salt is substantially inert, unless activated. Effective results can be achieved, for example, if a proportion of from 0.1% to 15% by weight of onium salt is employed, based on the weight of polymerizable composition. Higher or lower amounts can be used, however, depending upon factors such as the nature of organic material, intensity of radiation, polymerization time desired, etc.

It has been found that the onium salt of formula I also can be generated in situ in the presence of the organic material if desired. For example, an onium salt of the formula $$(R)_a(R^1)_b(R^2)_cX^+Q'', \qquad (II)$$

where R, $R^1$, $R^2$, X, a, b and c are as previously defined, and Q″ is an anion such as Cl−, Br−, I−, F−, $HSO_4^-$ and $NO_3^-$, etc. can be separately or simultaneously introduced into the organic material with a Lewis Acid of the formula,

M′(MQ)

where M and Q are as previously defined and M′ is a metal such as an alkali metal, for example, Na, K, etc., alkaline earth, such as Ca++, Mg++ and organic cations such as quaternary ammonium, pyridinium, etc.

The polymerizable compositions may contain inactive ingredients such as silica fillers, dyes, extenders, viscosity control agents, process aids, etc. in amounts of from up to 100 parts of filler per 100 parts of organic material. The polymerizable compositions of the present invention can be used as molding and extrusion resins, adhesives, caulks, coatings, blood plasma extenders, lubricants, etc.

Polymerization can be achieved by activating the onium salt to provide the release of the Lewis Acid catalyst. Activation of the onium salt can be achieved by heating the composition at a temperature in the range of from 150° C. to 250° C. Preferably polymerization can be achieved by exposing the polymerizable composition to radiant energy such as electron beam or ultraviolet light. Electron beam cure can be effected at an accelerator voltage of from about 100 to 1000 KV. Polymerization is preferably achieved by the use of UV irradiation having a wavelength of from 1849 Å to 4000 Å. The lamp systems used to generate such radiation can consist of ultraviolet lamps such as from 1 to 50 discharge lamps, for example, xenon, metallic halide, metallic arc, such as a low, medium or high pressure mercury vapor discharge lamp, etc. having an operating pressure of from a few millimeters to about 10 atmospheres, etc., can be employed. The lamps can include envelopes capable of transmitting light of a wavelength preferably of 2400 Å to 4000 Å. The lamp envelope can consist of quartz, such as Spectrocil or Pyrex, etc. Typical lamps which can be employed for providing ultraviolet radiation are, for example, medium pressure mercury arcs, such as the GE H3T7 arc and the Hanovia 450 W arc lamp. The cures may be carried out with a combination of various lamps, some or all of which can operate in an inert atmosphere. When using UV lamps, the irradiation flux in the substrate can be at least 0.01 watts per square inch to effect polymerization of the organic material within 1 to 20 seconds and permit the reaction to be carried on continuously as, for example, in the curing of multifunctional vinyl ether coated steel strip or paper web to be taken up at a rate of from 100 to 600 feet per minute. The strip can be cut to a predetermined width for use as printed material. A combination of heat and light may be used to cure reactive compositions. Such a combination of heat and light may serve to reduce the overall cure time.

In order that those skilled in the art will be better able to practice the invention, the following examples are given by way of illustration and not by way of limitation. All parts are by weight.

EXAMPLE 1

A mixture containing 3% by weight triphenylphenacylphosphonium fluoroborate in ethylene glycol divinyl ether was coated onto a glass plate to form a 2 mil film. The film was subjected to an ultraviolet irradiation of 200 mw/sq in using a GE H3T7 lamp at a distance of four inches from the sample. A clear, hard, tack-free coating was produced after 1.5 minutes. The film could not be removed by rubbing it with acetone.

The same composition was applied to a steel plate as a 0.1 mil coating. In this case, cure took place in one minute. The coated steel could be used to make a transformer core.

EXAMPLE 2

To 98 parts diethylene glycol divinyl ether there was added 2 parts of 2,5-dihydroxyphenyltriphenylphosphonium fluoroborate.

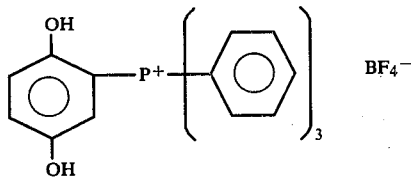

A thin film of about 1 mil thickness was knife coated onto polystyrene sheet and then cured to a hard tack-free surface in 1 minute. A composite of polystyrene sheet having a mar-free surface was obtained.

EXAMPLE 3

A mixture of 2 parts of triphenylphenacylphosphonium hexafluorophosphate, 5 parts carbon black and 93 parts of trimethylolpropane trivinyl ether, was tumbled in a ball mill for 1 hour. It was applied onto a sheet of white paper as a printing ink. After exposing the treated paper to a GE H3T7 medium pressure mercury arc lamp for 30 seconds at a distance of 2 inches, the applied resin was dry and tack-free.

EXAMPLE 4

A stack of several 6 in×6 in pieces of glass cloth were separately impregnated with a solution of trimethylolpropane trivinyl ether containing 2% by weight of triphenylphenacylphosphonium hexafluoroarsenate. The stack of treated glass cloth was irradiated for 2 minutes on both sides with a GE H3T7 medium pressure mercury arc lamp at a distance of 4 inches. A cured rigid structure was obtained which could be used as a circuit board base.

EXAMPLE 5

A mixture of 10 parts of ethylene glycol divinyl ether, 0.5 part of triphenylphenarylphosphonium bromide, and 2.1 parts sodium hexafluoroarsenate was stirred several hours and allowed to settle. A one mil film of the clear liquid was applied to a glass plate. The resin was irradiated for one minute as described previously in Example 1 to produce a hard, tack-free film on the surface of the glass plate.

EXAMPLE 6

A solution of diethylene glycol divinyl ether containing 2% by weight methyldiphenylphenacyl arsonium fluoroborate was coated on a 3 in×6 in steel plate. A perforated mask was then placed over the coating and the coating was exposed to ultraviolet light using a GE H3T7 medium pressure mercury arc lamp at a distance of 2 inches. After 30 seconds exposure, the mask was removed and the plate was washed with i-propanol. A clear, raised negative image of the mask was formed. Those skilled in the art would know that the use of this photo-imaging technique could be used for making printing plates and for the manufacture of semiconductor devices.

EXAMPLE 7

A blend of 20 parts n-butyl vinyl ether and 80 parts diethylene glycol divinyl ether was mixed with 2 parts triphenylphosphonium hexafluoroantimonate. The mixture was coated as a 2 mil film on a glass plate. It was irradiated as described in Example 1. A tough, tack-free hydrophobic coating was formed on the surface of the glass plate. It was found to be organic solvent resistant.

Although the above examples are limited to only a few of the very many polymerizable compositions and uses thereof which are included within the scope of the present invention, it should be understood that the present invention is intended to cover a much broader class of polymerizable compositions and uses thereof. Those skilled in the art would also know that the polymerizable compositions also cover the use of onium polymers containing Group Va onium functionality as part of the polymer backbone or in the pendant position. In addition, the onium salts of formula I are not intended to include compounds having the $-N^+\equiv N$ radical.

What I claim as new and desire to secure by Letters Patent of the United States is:
1. A method which comprises
   (1) mixing a cationically polymerizable organic material free of oxirane oxygen with an effective amount of a radiation sensitive Group Va onium salt having the formula,

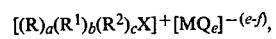

where
   R is a monovalent aromatic organic radical selected from carbocyclic radicals and heterocyclic radicals, $R^1$ is a monovalent organic aliphatic radical selected from alkyl, cycloalkyl and substituted derivatives thereof, $R^2$ is a polyvalent organic radical forming an aromatic heterocyclic or fused ring structure with X, X is a Group Va element selected from N, P, As, Sb and Bi, M is a metal or metalloid, Q is a halogen radical, a is a whole number equal to 0 to 4 inclusive, b is a whole number equal to 0 to 2 inclusive, c is a whole number equal to 0 to 2 inclusive, and the sum of A+b+c is a value equal to 4 or the valence of X, $d = e - f$, $f$ = valence of M and is an integer equal to from 2 to 7 inclusive, e is f and is an integer having a value up to 8, (2) applying the mixture onto a substrate, and (3) exposing the mixture of (1) to ultraviolet radiation.

2. A method for imparting an image on the surface of a substrate in accordance with claim 1, by (a) treating the substrate with the composition of step (1), (b) placing a mask over the treated substrate, (c) exposing the treated substrate to ultraviolet light, and (d) washing the substrate with a suitable solvent.

* * * * *

UNITED STATES PATENT AND TRADEMARK OFFICE
CERTIFICATE OF CORRECTION

PATENT NO. : 4,150,998
DATED : April 24, 1979
INVENTOR(S) : Charles R. Morelock

It is certified that error appears in the above—identified patent and that said Letters Patent is hereby corrected as shown below:

Column 4, line 16, claim 1, after "size" insert --in the range of from 25 microns to 200 microns,--.

Signed and Sealed this

Twenty-sixth Day of August 1980

[SEAL]

Attest:

SIDNEY A. DIAMOND

Attesting Officer   Commissioner of Patents and Trademarks